(12) United States Patent
Lee et al.

(10) Patent No.: US 9,184,181 B2
(45) Date of Patent: Nov. 10, 2015

(54) DISPLAY SUBSTRATE INCLUDING A THIN FILM TRANSISTOR AND METHOD OF MANUFACTURING THE SAME

(71) Applicant: Samsung Display Co., LTD., Yongin, Gyeonggi-Do (KR)

(72) Inventors: Je-Hun Lee, Seoul (KR); Sung-Hoon Yang, Seoul (KR); Hiroshi Okumura, Hwaseong-si (KR); Jin-Ho Hwang, Osan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/454,822

(22) Filed: Aug. 8, 2014

(65) Prior Publication Data
US 2015/0053970 A1 Feb. 26, 2015

(30) Foreign Application Priority Data

Aug. 20, 2013 (KR) ........................ 10-2013-0098337

(51) Int. Cl.
*H01L 21/00* (2006.01)
*H01L 21/84* (2006.01)
(Continued)

(52) U.S. Cl.
CPC ........ *H01L 27/1225* (2013.01); *H01L 27/1259* (2013.01)

(58) Field of Classification Search
CPC ... H01L 29/458; H01L 21/441; H01L 27/127; H01L 27/3262; H01L 29/786; H01L 27/1225; H01L 27/1259
USPC ............ 438/104, 149, 151, 161, 624; 257/43, 257/59, 72, E21.158, E21.414, E21.495, 257/E21.476, E21.535
See application file for complete search history.

(56) References Cited

U.S. PATENT DOCUMENTS 7,956,947 B2 6/2011 Lee et al.
8,389,326 B2 3/2013 Sasaki et al.
(Continued)

FOREIGN PATENT DOCUMENTS

KR 1020140101526 A 8/2014

OTHER PUBLICATIONS

Ahn et al., "Comparison of the effects of Ar and H2 plasmas on the performance of homojunctioned amorphous indium gallium zinc oxide thin film transistors", Applied Physics Letters, vol. 93. 2008,pp. 203506-1-203506-3.
(Continued)

*Primary Examiner* — Mohsen Ahmadi
(74) *Attorney, Agent, or Firm* — Cantor Colburn LLP

(57) ABSTRACT

A display substrate includes a gate electrode on a base substrate, an active pattern which overlaps the gate electrode and includes a metal oxide semiconductor, an insulation pattern on the active pattern, a source electrode which contacts the active pattern, a drain electrode which contacts the active pattern and is spaced apart from the source electrode, and a first passivation layer which covers the active pattern and the insulation pattern, and includes fluorine, where the active pattern includes a first portion which directly contacts the insulation pattern and overlaps the gate electrode and the insulation pattern, a second portion which contacts the first passivation layer and has an electrical conductivity substantially larger than that of the first portion, a third portion which contacts the first passivation layer, has an electrical conductivity substantially larger than that of the first portion and is spaced apart from the second portion.

16 Claims, 11 Drawing Sheets

(51) Int. Cl.
*H01L 29/10* (2006.01)
*H01L 29/12* (2006.01)
*H01L 29/04* (2006.01)
*H01L 27/14* (2006.01)
*H01L 27/12* (2006.01)

(56) References Cited

U.S. PATENT DOCUMENTS

| | | |
|---|---|---|
| 8,389,991 B2 | 3/2013 | Morosawa et al. |
| 8,394,671 B2 | 3/2013 | Sasaki et al. |
| 2011/0175080 A1* | 7/2011 | Kim et al. ............. 257/43 |
| 2012/0119206 A1 | 5/2012 | Wang et al. |
| 2013/0069238 A1 | 3/2013 | Usami et al. |
| 2013/0169901 A1* | 7/2013 | Kim et al. ............. 349/43 |
| 2015/0008426 A1* | 1/2015 | Cho et al. ............. 257/43 |

OTHER PUBLICATIONS

Park et al., "Self-aligned top-gate amorphous gallium indium zinc oxide thin film transistor", Applied Physics Letters, vol. 93, 2008, pp. 053501-1-053501-3.

Sato et al., "Amorphous In—Ga—Zn—O coplanar homojunction thin-film transistor", Applied Physics Letters, vol. 94, 2009, pp. 133502-1-133502-3.

* cited by examiner

DISPLAY SUBSTRATE INCLUDING A THIN FILM TRANSISTOR AND METHOD OF MANUFACTURING THE SAME

This application claims priority to Korean Patent Application No. 10-2013-0098337, filed on Aug. 20, 2013, and all the benefits accruing therefrom under 35 U.S.C. §119, the contents of which application are herein incorporated by reference in their entirety.

BACKGROUND

1. Field

The exemplary embodiment of invention relates to a display substrate including a thin film transistor and a method of manufacturing the display substrate.

2. Description of Related Technology

Generally, a thin film transistor ("TFT") for driving a pixel in a display device includes a gate electrode, a source electrode, a drain electrode, and an active pattern forming a channel between the source electrode and the drain electrode. The active pattern includes a semiconductor layer including amorphous silicon, polycrystalline silicon, oxide semiconductor, or the like.

Amorphous silicon has a relatively low electron mobility, which may be about 1 square centimeter per volt second ($cm^2/V \cdot s$) to about 10 $cm^2/V \cdot s$, so that a TFT including amorphous silicon has relatively low driving characteristics. In contrast, polycrystalline silicon has a relatively high electron mobility, which may be about 10 $cm^2/V \cdot s$ to about hundreds $cm^2/V \cdot s$. However, a crystallization process is used for forming polycrystalline silicon. Thus, forming a uniform polycrystalline silicon layer on a large-sized substrate may be difficult, and resulting manufacturing costs are high. Oxide semiconductors may be formed through a low-temperature process, may be easily formed in a large-scale, and have a high electron mobility. Thus, research is actively being conducted on TFTs which include an oxide semiconductor.

SUMMARY

One or more exemplary embodiment provides a display substrate having improved reliability.

One or more exemplary embodiment provides a method of manufacturing a display substrate having improved reliability.

According to an exemplary embodiment, a display substrate includes a base substrate, a gate electrode, an active pattern, an insulation pattern, a source electrode, a drain electrode and a first passivation layer. The gate electrode is disposed on a base substrate. The active pattern overlaps the gate electrode and includes a metal oxide semiconductor. The insulation pattern is disposed on the active pattern. The source electrode contacts the active pattern. The drain electrode contacts the active pattern and is spaced apart from the source electrode. The first passivation layer including fluorine covers the active pattern and the insulation pattern. The active pattern includes a first portion which directly contacts the insulation pattern and overlaps the gate electrode and the insulation pattern, a second portion which contacts the first passivation layer and has an electrical conductivity substantially larger than an electrical conductivity of the first portion and a third portion which contacts the first passivation layer, has an electrical conductivity substantially larger than the electrical conductivity of the first portion and is spaced apart from the second portion.

In an exemplary embodiment, the first passivation layer may further include fluorinated silicon oxide, fluorinated silicon nitride, fluorinated silicon carbide, fluorinated silicon oxy-nitride, fluorinated silicon oxy-carbide, or any combinations thereof.

In an exemplary embodiment, the first portion may include a p-type semiconductor, and the second portion and the third portion may include an n-type semiconductor.

In an exemplary embodiment, the second portion and the third portion may include a fluorine content larger than that of the first portion.

In an exemplary embodiment, the active pattern may further include a fourth portion contacting the second portion and overlapping the source electrode and a fifth portion contacting the third portion and overlapping the drain electrode.

In an exemplary embodiment, the fourth portion and the fifth portion may include a p-type semiconductor and include fluorine contents smaller than those of the second portion and third portion.

In an exemplary embodiment, the source electrode and the drain electrode may be exposed by the insulation pattern.

In an exemplary embodiment, the metal oxide semiconductor may include a tin content thereof between about 1 wt % to about 10 wt %.

In an exemplary embodiment, the second portion and the third portion may have a carrier density of between about 1 $E18/cm^3$ to about 1 $E22/cm^3$.

In an exemplary embodiment, the gate electrode may be disposed between the base substrate and the active pattern.

In an exemplary embodiment, the active pattern may be disposed between the base substrate and the gate electrode.

In an exemplary embodiment, openings which expose the second portion and the third portion of the active pattern are defined in the insulation pattern.

In an exemplary embodiment, the insulation pattern may have an isolated island shape.

In an exemplary embodiment, the second portion and the third portion of the active pattern may be exposed by the insulation pattern, the source electrode and the drain electrode.

In an exemplary embodiment, the display substrate may further include a second passivation layer disposed on the first passivation layer.

In an exemplary embodiment, the second passivation layer may include silicon oxide or silicon nitride.

According to an exemplary embodiment, a method for manufacturing a display substrate is provided. In the method, a gate electrode is disposed on a base substrate. An active pattern overlaps the gate electrode. The active pattern includes a metal oxide semiconductor. An insulation pattern partially covers the active pattern. A source electrode and a drain electrode contact the active pattern. A first passivation layer including fluorine covers the active pattern and the insulation pattern.

In an exemplary embodiment, forming the active pattern may include forming a metal oxide semiconductor layer including a p-type semiconductor.

In an exemplary embodiment, forming the first passivation layer may include implanting fluorine atoms into portions of the active pattern, thereby converting the p-type semiconductor to an n-type semiconductor.

In an exemplary embodiment, a second passivation layer is disposed on the first passivation layer.

According to an exemplary embodiment, a thin film transistor ("TFT") of a display substrate includes a gate electrode, a gate insulation layer, an active pattern, an insulation pattern, a source electrode and a drain electrode, and the TFT is covered by a passivation layer. The passivation layer includes fluorine atoms, so that portions of the active pattern are doped with the fluorine atoms. A second portion and a third portion of the active pattern which is doped with the fluorine atoms have an improved conductivity, and a first portion between the second portion and the third portion serves as a channel region. Therefore, a length of the channel region decreases, and the second portion and the third portion are self-aligned not to overlap the insulation pattern.

BRIEF DESCRIPTION OF THE DRAWINGS

The above and other features and advantages will become more apparent by describing exemplary embodiments thereof with reference to the accompanying drawings, in which.

DETAILED DESCRIPTION

Figure 1:
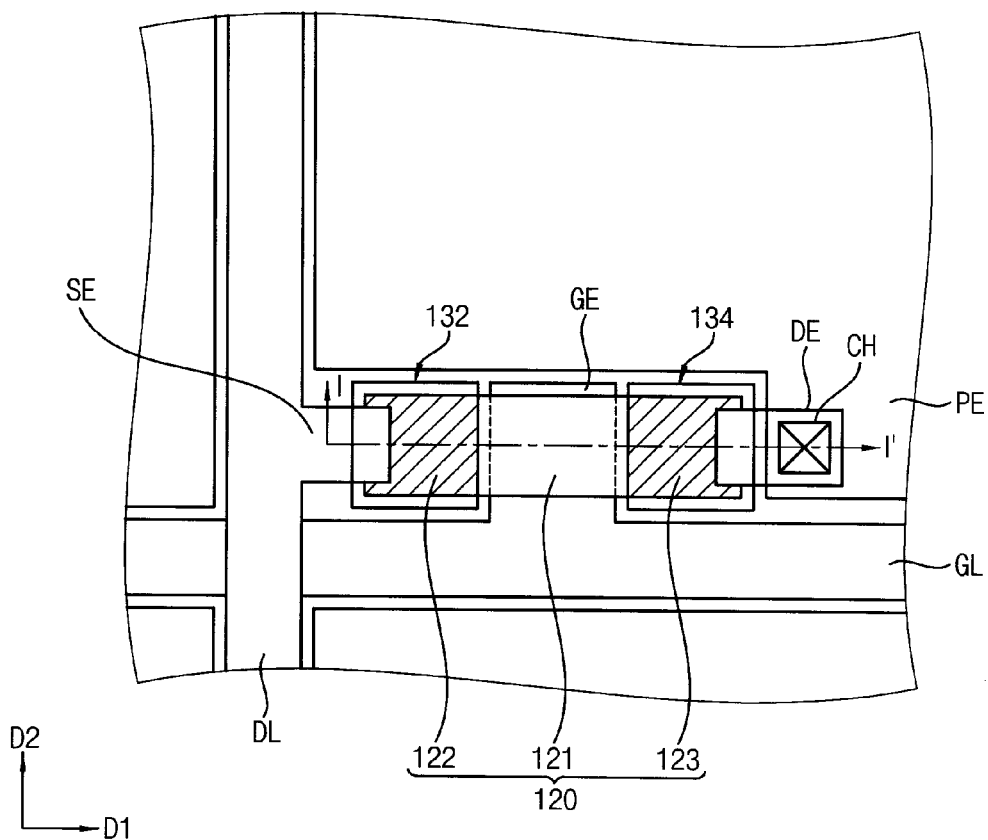
FIG. 1 is a plan view illustrating an exemplary embodiment of a display substrate according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiment of the invention will be explained in detail with reference to the accompanying drawings.

Figure 2:
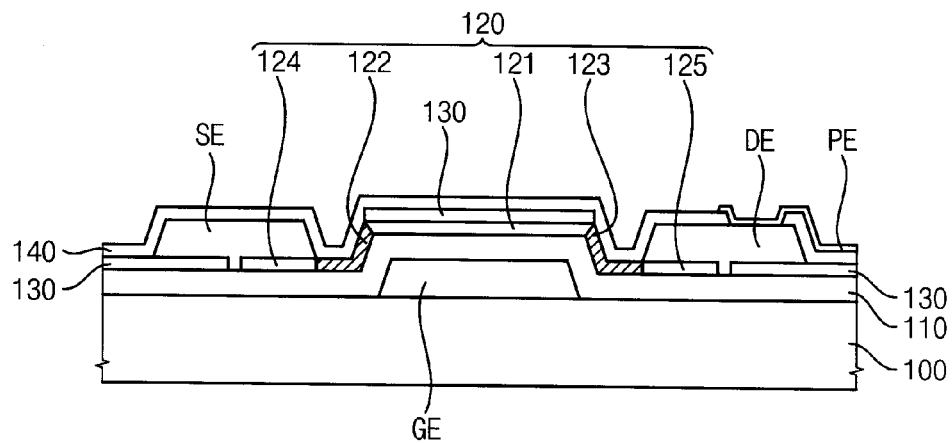
FIG. 2 is a cross-sectional view taken along line I-I' of FIG. 1.

FIG. 1 is a plan view illustrating a display substrate according to an exemplary embodiment of the invention. FIG. 2 is a cross-sectional view taken along line I-I' of FIG. 1.

Referring to FIGS. 1 and 2, the display substrate according to an exemplary embodiment of the invention includes a base substrate 100, a gate line GL, a data line DL, a thin film transistor ("TFT"), a passivation layer 140 and a pixel electrode PE. The TFT includes a gate electrode GE, a gate insulation layer 110, an active pattern 120, an insulation pattern 130, a source electrode SE and a drain electrode DE.

The gate line GL extends in a first direction D1, and the data line DL extends in a second direction D2 in a plan view. The first direction D1 crosses the second direction D2. In one exemplary embodiment, the first direction D1 may be substantially perpendicular to the second direction D2.

The gate line GL is electrically connected to the gate electrode GE. In an exemplary embodiment, the gate electrode GE may protrude from the gate line GL in the second direction D2.

The gate insulation layer 110 may be disposed on the base substrate 100 to cover the gate line GL and the gate electrode GE. In an exemplary embodiment, the gate insulation layer 110 may include an insulation material such as silicon oxide or silicon nitride, etc. In an exemplary embodiment, the gate insulation layer 110 may include silicon oxide such as boro-phospho-silicate glass ("BPSG"), tonen silazene ("TOSZ"), undoped silicate glass ("USG"), spin on glass ("SOG"), flowable oxide ("FOX"), tetra-ethyl-ortho-silicate ("TEOS"), high density plasma chemical vapor deposition ("HDP-CVD"), etc. In another exemplary embodiment, the gate insulation layer 110 may have a multilayer structure including silicon oxide and silicon nitride.

The active pattern 120 on the gate insulation layer 110 overlaps the gate electrode GE. In an exemplary embodiment, the active pattern 120 may extend in the first direction D1, and a center portion of the active pattern 120 may overlap the gate electrode GE.

The active pattern 120 includes a metal oxide semiconductor. That is, the active pattern 120 may include oxide of indium, zinc, gallium, tin, hafnium or any combinations thereof. In an exemplary embodiment, the active pattern 120 may include indium-zinc-tin oxide ("IZTO"), indium-gallium-zinc oxide ("IGZO") or hafnium-indium-zinc oxide ("HIZO"), for example.

In an exemplary embodiment, the metal oxide semiconductor may further include tin (Sn). In an exemplary embodiment, the metal oxide semiconductor may include a tin content thereof between about 1 wt % to about 10 wt %, for example. That is, the active pattern 120 may include IZTO, tin doped IGZO or tin doped HIZO, for example.

The active pattern 120 may be divided into a first portion 121, a second portion 122, a third portion 123, a fourth portion 124 and a fifth portion 125 depending on the fluorine content.

The first portion 121 of the active pattern 120 overlaps the gate electrode GE and the insulation pattern 130. The first portion 121 of the active pattern 120 may not directly contact the passivation layer 140, so that fluorine atoms may not diffuse from the passivation layer 140 to the first portion 121 of the active pattern 120. The first portion 121 may not include fluorine or may include relatively small fluorine content. Further, the metal oxide semiconductor of the first portion 121 may include an oxygen content substantially smaller than that of an intrinsic semiconductor. Therefore, the metal oxide semiconductor of the first portion 121 may include a p-type semiconductor which includes a plurality of oxygen vacancies and have a relative large hole density. The first portion 121 of the active pattern 120 serves as a channel region of the TFT.

The second portion 122 and the third portion 123 of the active pattern 120 directly contact the first portion 121. Further, the second portion 122 and the third portion 123 may be spaced apart from each other in the first direction D1. The second portion 122 and the third portion 123 may not overlap the insulation pattern 130, the source electrode SE and the drain electrode DE, and may directly contact the passivation layer 140. Therefore, the second portion 122 and the third portion 123 may include a fluorine content substantially larger than that of the first portion 121, and may include an n-type semiconductor. Further, the second portion 122 and the third portion 123 may have a relatively larger electron density and a relatively high electrical conductivity. Therefore, the second portion 122 and the third portion 123 do not serve as the channel region of the TFT. The second portion 122 and the third portion 123 may effectively reduce an electrical resistance between the source/drain electrode SE/DE and the channel region of the TFT. In an exemplary embodiment, the second portion 122 and the third portion 123 may have a carrier density of between about 1 E18 per one cubic centimeter (/cm$^3$) to about 1 E22/cm$^3$ The fourth portion 124 and the fifth portion 125 of the active pattern 120 contact the second portion 122 and the third portion 123, respectively. In an exemplary embodiment, the fourth portion 124 may overlap the source electrode SE, and the fifth portion 125 may overlap the drain electrode DE. The fourth portion 124 and the fifth portion 125 of the active pattern 120 may not directly contact the passivation layer 140, so that fluorine atoms may not diffuse from the passivation layer 140 to the fourth portion 124 and the fifth portion 125 of the active pattern 120. The fourth portion 124 and the fifth portion 125 may include a fluorine content substantially lower than those of the second portion 122 and the third portion 123. In an exemplary embodiment, the fourth portion 124 and the fifth portion 125 may include a p-type semiconductor.

According to exemplary embodiments, the active pattern 120 may be selectively doped with fluorine, the electrical resistance between the source/drain electrode SE/DE and the channel region of the TFT may decrease. When the fluorine atoms are doped into the second portion 122 and the third portion 123, the fluorine atoms may not diffuse into the first portion 121, because the fluorine atoms have a relatively large atomic weight. Therefore, a length of the channel region (that is, a width of the first portion 121) may not vary due to the diffusion of the fluorine atoms, and a reliability of a threshold voltage of the TFT may be improved.

The insulation pattern 130 is disposed on the active pattern 120 and the gate insulation layer 110. In an exemplary embodiment, the insulation pattern 130 may include an insulation material such as silicon oxide. In exemplary embodiments, the insulation pattern 130 may entirely locate on the active pattern 120 and the gate insulation layer 110, and openings 132 and 134 may be defined in the insulation pattern 130. The first opening 132 and the second opening 134 may pass through the insulation pattern 130 and may partially expose the active pattern 120. In an exemplary embodiment, the first opening 132 may expose the second portion 122 and the fourth portion 124 of the active pattern 120, and the second opening 134 may expose the third portion 123 and the fifth portion 125 of the active pattern 120. The insulation pattern 130 may protect the active pattern 120 during the processes of manufacturing the TFT, particularly an etching process. That is, the insulation pattern 130 may serve as an etch stopper for protecting the active pattern 120.

Referring now to FIGS. 1 and 2, the source electrode SE and the drain electrode DE are spaced apart from each other, and contact the active pattern 120. Particularly, the source electrode SE may overlap the fourth portion 124 of the active pattern 120, and the drain electrode DE may overlap the fifth portion 125 of the active pattern 120. The fourth portion 124 and the fifth portion 125 may include the p-type semiconductor, so that ohmic contacts may be disposed between the fourth portion 124 and the source electrode SE and between fifth portion 125 and the drain electrode DE. Therefore, a contact resistance between the source electrode SE, the drain electrode DE and the active pattern 120 may decrease.

The source electrode SE is electrically connected to a data line DL. In an exemplary embodiment, the source electrode SE may protrude from the data line DL in the first direction D1.

The passivation layer 140 covers the TFT. The passivation layer 140 includes an inorganic insulation material comprising fluorine. In an exemplary embodiment, the passivation layer 140 may include fluorinated silicon oxide (SiOF), fluorinated silicon nitride (SiNF), fluorinated silicon carbide (SiCF), fluorinated silicon oxy-nitride (SiONF) or fluorinated silicon oxy-carbide (SiOCF), for example.

The pixel electrode PE is disposed on the passivation layer 140. The pixel electrode PE disposed in a contact hole CH defined in the passivation layer 140, so that the pixel electrode PE contacts the drain electrode DE. The pixel electrode PE includes a transparent conductive material. In an exemplary embodiment, the pixel electrode PE may include indium zinc oxide ("IZO"), indium tin oxide ("ITO"), tin oxide or zinc oxide, for example.

According to exemplary embodiments, the TFT of the display substrate include the gate electrode GE, the gate insulation layer 110, the active pattern 120, the insulation pattern 130, the source electrode SE and the drain electrode DE. The passivation layer 140 covers the TFT and directly contacts the active pattern 120 or the insulation pattern 130. The passivation layer 140 may include the inorganic insulation material including fluorine, so that the fluorine atoms may be selectively doped from the passivation layer 140 to the active pattern 120. The second portion 122 and the third portion 123 of the active pattern 120 may include a relatively high fluorine content and have a relatively low electrical resistance, and the first portion 121 between the second portion 122 and the third portion 123 may serve as the channel region of the TFT. Therefore, the length of the channel region may decrease, and the second portion 122 and the third portion 123 of the active pattern 120 may be self-aligned with the insulation pattern 130.

FIGS. 3 to 12 are cross-sectional views illustrating a method of manufacturing the display substrate illustrated in FIGS. 1 and 2. Particularly, FIGS. 4, 6, 8, 10 and 12 are plan views illustrating the method of manufacturing the display substrate, and FIGS. 3, 5, 7, 9, 11 and 13 are cross-sectional views taken along line IT of the plan views.

Figure 3:
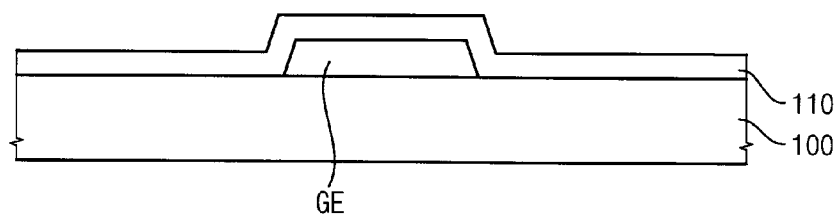
FIGS. 3 to 13 are plan views and cross-sectional views illustrating a method of manufacturing the display substrate illustrated in FIGS. 1 and 2.

Referring to FIG. 3, a gate line and a gate electrode GE are disposed on a base substrate 100, and then a gate insulation layer 110 covers the gate line and the gate electrode GE.

In one exemplary embodiment, a gate metal layer is disposed on the base substrate 100, and then the gate metal layer is patterned to provide the gate line and the gate electrode GE. In exemplary embodiment, the base substrate 100 may include a glass substrate, a quartz substrate, a silicon substrate, a plastic substrate and the like.

In an exemplary embodiment, a material that may be used for the gate metal layer may include copper, silver, chromium, molybdenum, aluminum, titanium, manganese, alloy thereof and the like. The gate metal layer may have a single-layered structure, or a multi-layered structure including a plurality of metal layers including different metals.

Then, the gate insulation layer 110 may be disposed on the gate line and the gate electrode GE by a chemical vapor deposition ("CVD") process or an atomic layer deposition ("ALD") process, for example. In an exemplary embodiment, the gate insulation layer 110 may include silicon oxide such as BPSG, TOSZ, USG, SOG, FOX, TEOS, HDP-CVD, etc. In another exemplary embodiment, the gate insulation layer 110 may have a multilayer structure including silicon oxide and silicon nitride.

Figure 4:
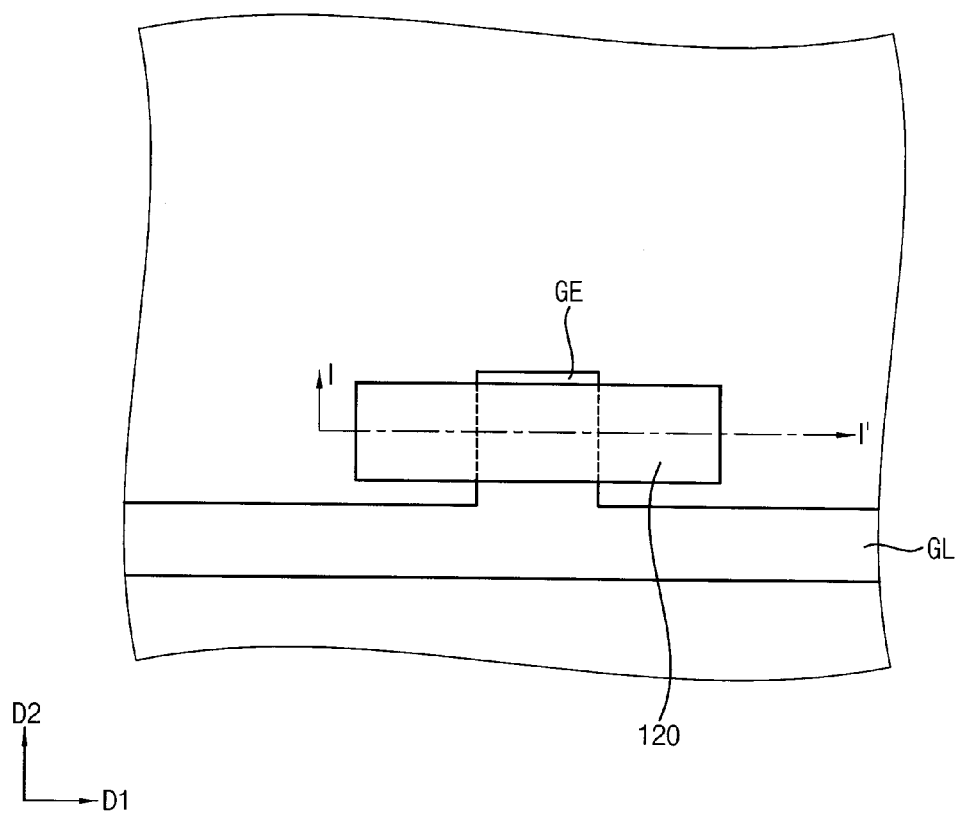
Figure 5:
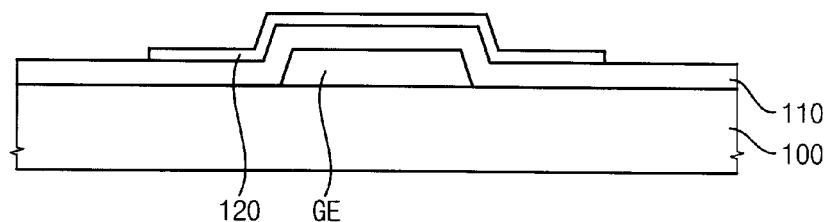

Referring to FIGS. 4 and 5, an active pattern 120 may be disposed on the gate insulation layer 110.

Particularly, a metal oxide semiconductor layer is disposed on the gate insulation layer 110, and then the metal oxide semiconductor layer is patterned to provide the active pattern 120. The active pattern 120 may overlap the gate electrode GE.

The metal oxide semiconductor layer may be provided through a physical vapor deposition process such as a vacuum deposition process or a sputtering process. The metal oxide semiconductor layer may be provided at a relatively high temperature above about 700° C. In an exemplary embodiment, metal oxide semiconductor layer may be provided using a sputtering target.

The active pattern 120 includes a metal oxide semiconductor. That is, the active pattern 120 may include oxide of indium, zinc, gallium, tin or hafnium. In an exemplary embodiment, the active pattern 120 may include IZTO, IGZO or HIZO, for example.

In an exemplary embodiment, the metal oxide semiconductor may further include tin (Sn). In an exemplary embodiment, the metal oxide semiconductor may include a tin content thereof between about 1 wt % to about 10 wt %. That is, the active pattern 120 may include ITZO, tin doped IGZO or tin doped HIZO, for example.

In an exemplary embodiment, the metal oxide semiconductor may include an oxygen content substantially smaller than that of an intrinsic semiconductor. Therefore, the metal oxide semiconductor may include a p-type semiconductor which includes a plurality of oxygen vacancies and have a relative large hole density.

In an exemplary embodiment, an annealing process may be further performed to heat the metal oxide semiconductor layer. In one exemplary embodiment, the annealing process may be performed at about 240 degrees Celsius (° C.) to about 400° C. The annealing process may improve electrical characteristics of the metal oxide semiconductor layer.

Figure 6:
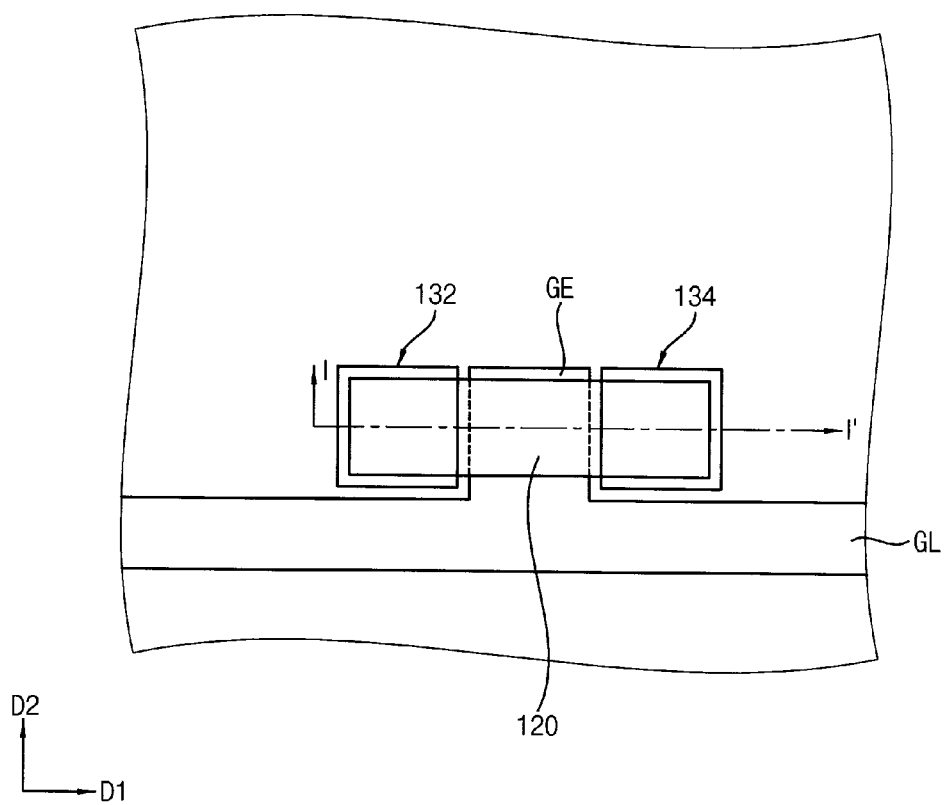
Figure 7:
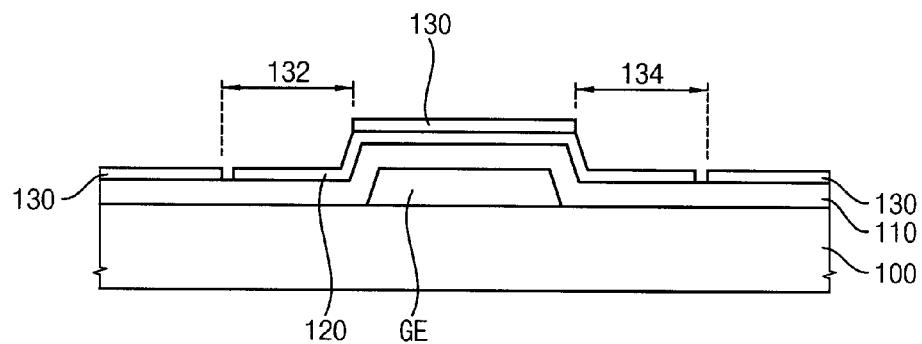

Referring to FIGS. 6 and 7, an insulation layer pattern 130 is disposed on the active pattern 120.

An insulation layer may cover the gate insulation layer 110 and the active pattern 120, and then the insulation layer may be partially removed to provide openings 132 and 134 which partially expose the active pattern 120. In an exemplary embodiment, the insulation layer may be provided using silicon oxide.

The first opening 132 and the second opening 134 may be defined not to overlap the gate electrode GE. That is, the first opening 132 and the second opening 134 may be spaced apart from each other in the first direction D1, and the gate electrode GE may be disposed between the first opening 132 and the second opening 134. Therefore, portions of the active pattern 120 exposed by the openings 132 and 134 may be defined not to overlap the gate electrode GE.

The insulation pattern 130 may protect the active pattern 120 during the processes of manufacturing the TFT, particularly an etching process. That is, the insulation pattern 130 may serve as an etch stopper for protecting the active pattern 120.

Figure 8:
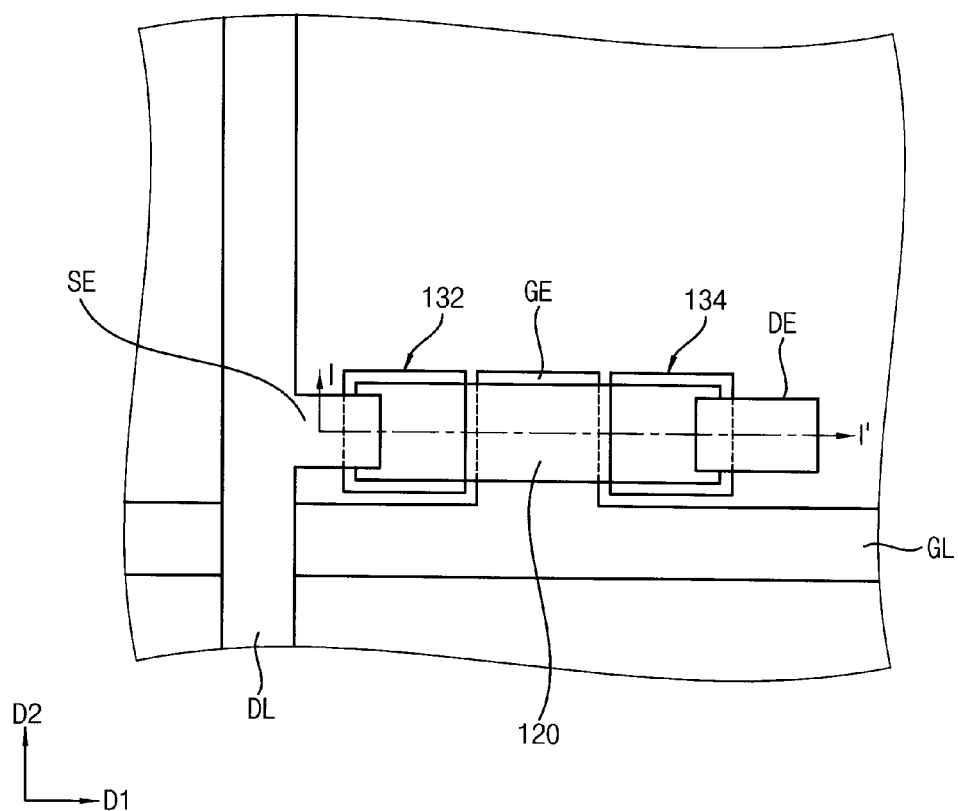
Figure 9:
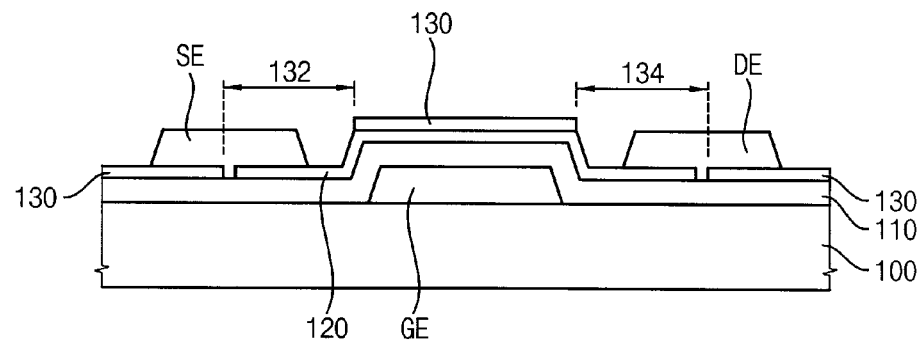

Referring to FIGS. 8 and 9, a drain electrode DE, a source electrode SE and a data line DL may be provided.

A data metal layer may be disposed on the active pattern 120 and the insulation pattern 130, and then the data metal layer maybe patterned to provide the drain electrode DE, the source electrode SE and the data line DL. In an exemplary embodiment, the data metal layer may be provided using a material substantially the same as or similar to that of the gate metal layer.

While patterning the data metal layer, the portions of the active pattern 120 are exposed by the first opening 132 and the second opening 134. In an exemplary embodiment, the active pattern 120 may include a tin content thereof between about 1 wt % to about 10 wt %, so that the metal oxide semiconductor of the active pattern 120 may have a relatively large etch selectivity with respect to the data metal layer. That is, the data metal layer may be patterned using an etching solution which has a relatively large etch rate about the data metal layer and has a relatively small etch rate about the metal oxide semiconductor layer. Therefore, the active pattern 120 may not be damaged during the patterning process.

Further, the data line DL extends in the second direction D2 on the insulation layer pattern 130. The source electrode SE is electrically connected to a data line DL. In an exemplary embodiment, the source electrode SE may protrude from the data line DL in the first direction D1. An end portion of the source electrode SE may directly contact the portions of the active pattern 120 exposed by the first opening 132. That is, the portions of the active pattern 120 exposed by the first opening 132 may overlap the source electrode SE.

The drain electrode DE is disposed on the insulation pattern 130. The drain electrode DE may directly contact the portions of the active pattern 120 exposed by the second opening 134. That is, the portions of the active pattern 120 exposed by the second opening 134 may overlap the drain electrode DE.

Figure 10:
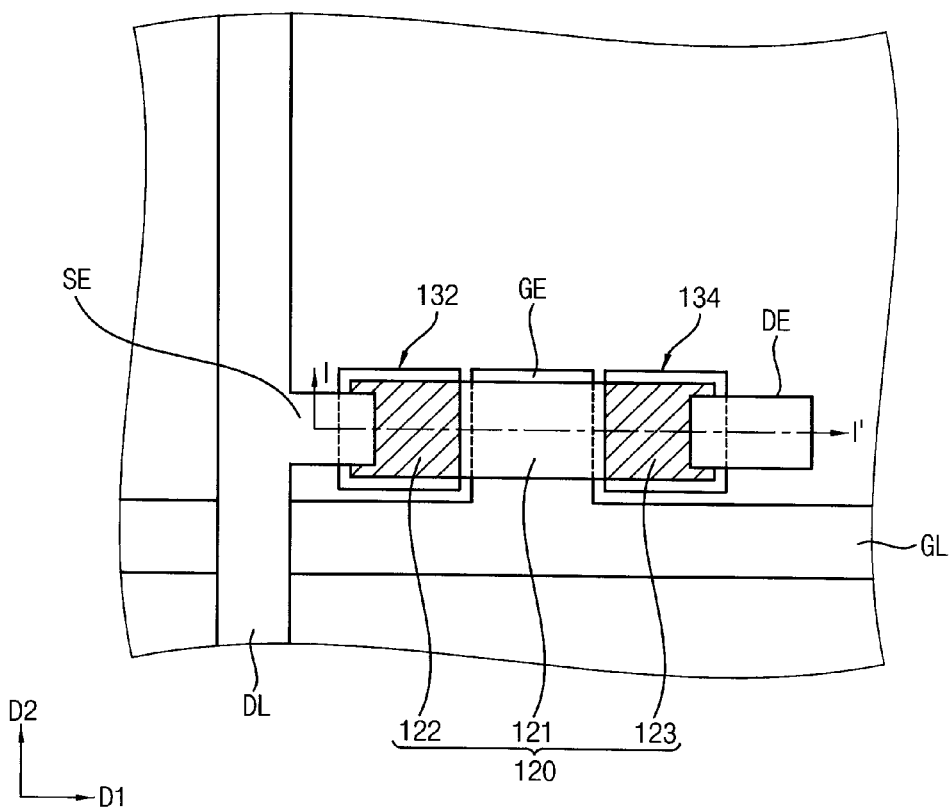
Figure 11:
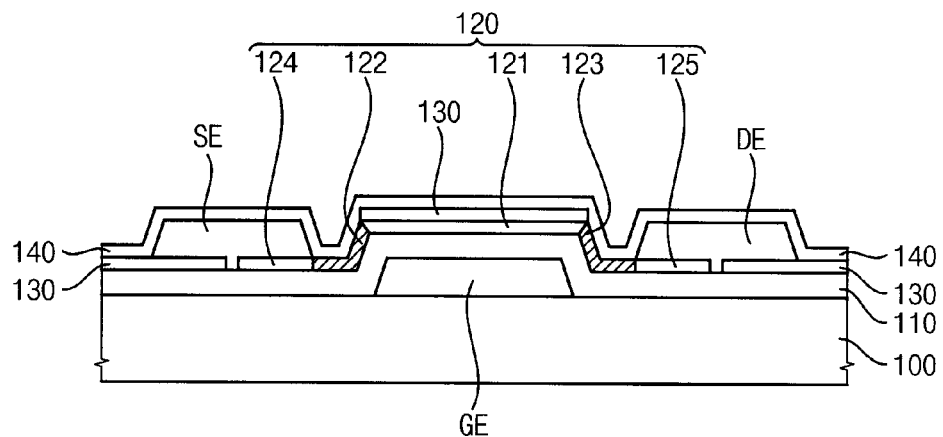

Referring to FIGS. 10 and 11, a passivation layer 140 may cover the active pattern 120, the source electrode SE and the drain electrode DE.

The passivation layer 140 may be provided by a CVD process, an ALD process or a plasma-enhanced CVD ("PECVD") process, for example. The passivation layer 140 is provided using an inorganic material including fluorine. In an exemplary embodiment, the passivation layer 140 may be provided using fluorinated silicon oxide (SiOF), fluorinated silicon nitride (SiNF), fluorinated silicon carbide (SiCF), fluorinated silicon oxy-nitride (SiONF), fluorinated silicon oxy-carbide (SiOCF) or any combinations thereof.

In an exemplary embodiment, the passivation layer 140 may be provided by a PECVD process using a silicon tetrafluoride ($SiF_4$) gas and a nitrous oxide ($N_2O$) gas as source gases, for example. In an exemplary embodiment, the PECVD process may provide a SiOF layer.

In another exemplary embodiment, the passivation layer 140 may be provided by a PECVD process using a silicon tetrafluoride ($SiF_4$) gas, a silane gas ($SiH_4$) and an oxygen ($O_2$) as source gases, for example. In an exemplary embodiment, the PECVD process may also provide a SiOF layer.

As the passivation layer 140 is disposed on the active pattern 120, fluorine atoms in the passivation layer 140 may diffuse into portions of the active pattern 120 which may directly contact the passivation layer 140. The portions of the active pattern 120 may be converted from the p-type semiconductor to an n-type semiconductor.

Therefore, the active pattern 120 may be divided into a first portion 121, a second portion 122, a third portion 123, a fourth portion 124 and a fifth portion 125 depending on the fluorine content.

The first portion 121 of the active pattern 120 overlaps the gate electrode GE. The first portion 121 of the active pattern 120 may not directly contact the passivation layer 140, so that fluorine atoms may not diffuse from the passivation layer 140 to the first portion 121 of the active pattern 120. The first portion 121 of the active pattern 120 serves as a channel region of the TFT. That is, the channel region of the TFT (that is, the first portion 121) may be self-aligned not to overlap the insulation pattern 130.

The second portion 122 and the third portion 123 of the active pattern 120 directly contact the first portion 121. Further, the second portion 122 and the third portion 123 may be spaced apart from each other in the first direction D1. The second portion 122 and the third portion 123 may not overlap the insulation pattern 130, the source electrode SE and the drain electrode DE, and may directly contact the passivation layer 140. Therefore, the second portion 122 and the third portion 123 may include a fluorine content substantially larger than that of the first portion 121, and may include an n-type semiconductor. Further, the second portion 122 and the third portion 123 may have a relatively larger electron density and a relatively high electrical conductivity. Therefore, the second portion 122 and the third portion 123 do not serve as the channel region of the TFT.

The fourth portion 124 and the fifth portion 125 of the active pattern 120 contact the second portion 122 and the third portion 123, respectively. In an exemplary embodiment, the fourth portion 124 may overlap the source electrode SE, and the fifth portion 125 may overlap the drain electrode DE. The fourth portion 124 and the fifth portion 125 of the active pattern 120 may not directly contact the passivation layer 140, so that fluorine atoms may not diffuse from the passivation layer 140 to the fourth portion 124 and the fifth portion 125 of the active pattern 120. The fourth portion 124 and the fifth portion 125 may include a fluorine content substantially lower than those of the second portion 122 and the third portion 123.

According to exemplary embodiments, while providing the passivation layer 140, the second portion 122 and the third portion 123 of the active pattern 120 are doped with fluorine atoms. The second portion 122 and the third portion 123 may effectively reduce an electrical resistance between the source/drain electrode SE/DE and the channel region of the TFT.

Further, an additional process for implanting impurities into the active pattern 120 may be omitted, so that the processes for manufacturing the display substrate may be simplified.

Figure 12:
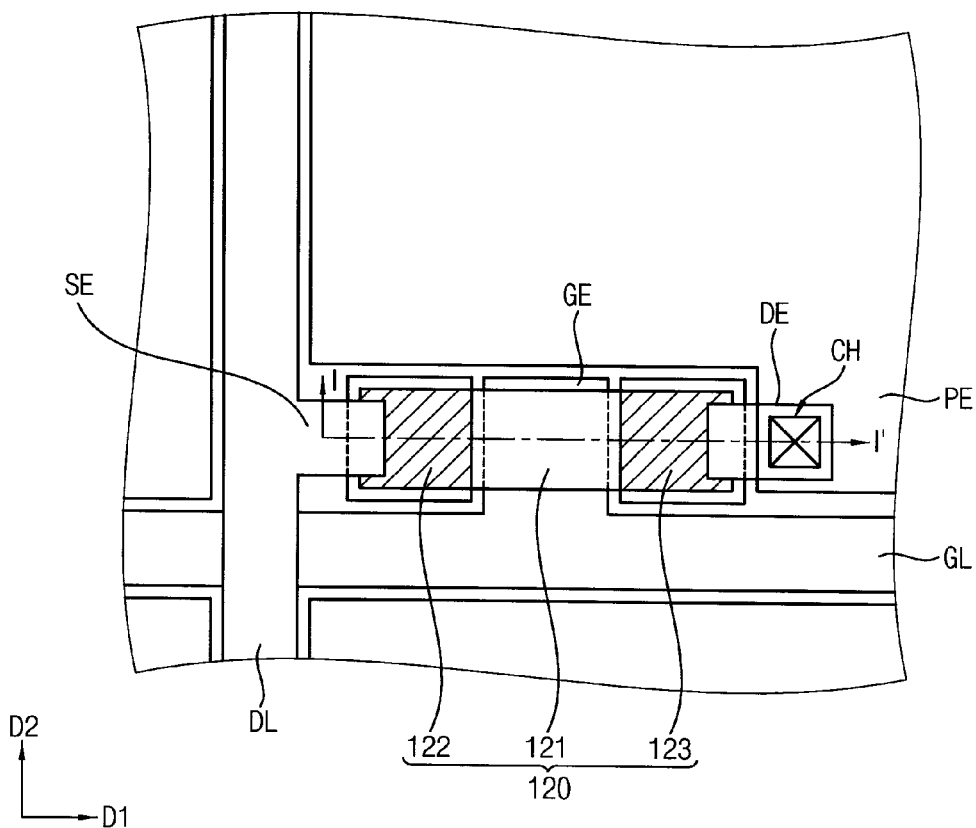
Figure 13:
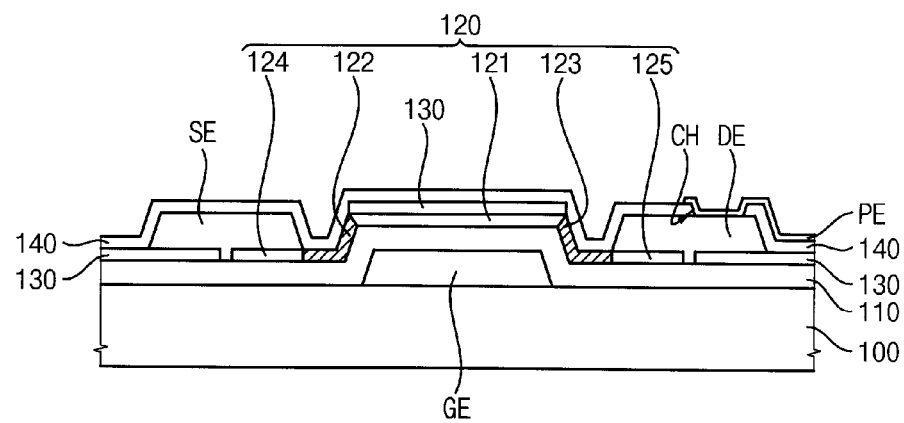

Referring to FIGS. 12 and 13, a pixel electrode PE may contact the drain electrode DE.

Particularly, the passivation layer 140 is partially removed to provide a contact hole CH exposing the drain electrode DE, and a pixel electrode layer is disposed on the passivation layer 140 and an inner wall of the contact hole CH. Then the pixel electrode layer is patterned to provide the pixel electrode PE.

In an exemplary embodiment, the pixel electrode PE may include indium zinc oxide ("IZO"), indium tin oxide ("ITO"), tin oxide or zinc oxide.

In the exemplary embodiment illustrated with reference to FIGS. 1 and 2, the TFT of the display substrate may include the insulation pattern 130, and openings 132 and 134 that have a rectangular shape in a plan view are defined in the insulation pattern 130. In another exemplary embodiment, the shapes of openings may be changed. Hereinafter, another display substrate having a TFT including insulation pattern will be explained.

Figure 14:
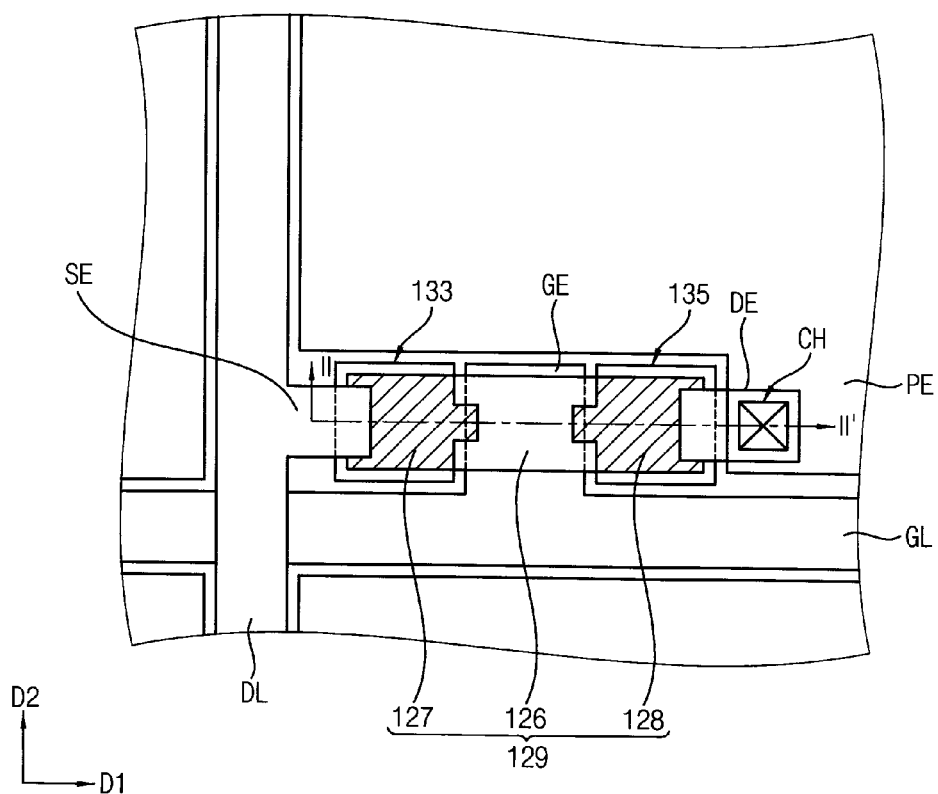
FIG. 14 is a plan view illustrating another exemplary embodiment of a display substrate according to the invention.
Figure 15:
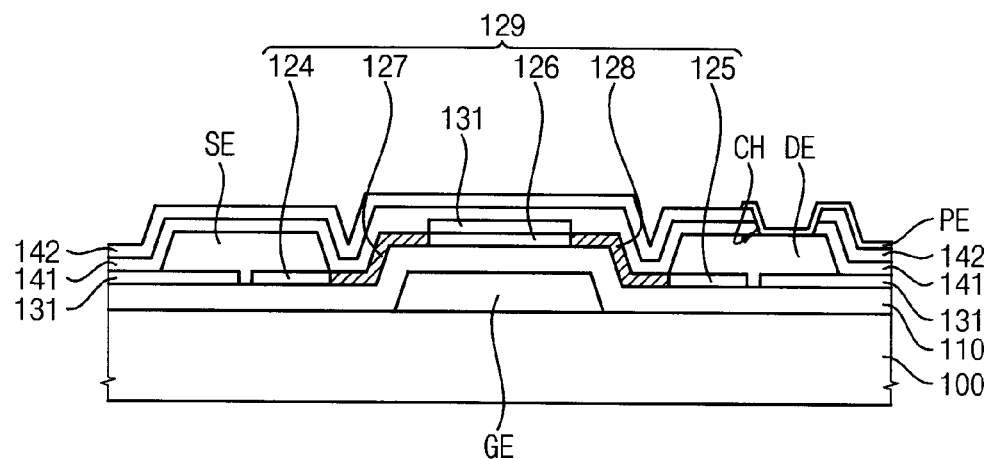
FIG. 15 is a cross-sectional view taken along line II-II' of FIG. 14.

FIG. 14 is a plan view illustrating a display substrate according to another exemplary embodiment of the invention, and FIG. 15 is a cross-sectional view taken along line II-II' of FIG. 14.

Referring to FIGS. 14 and 15, the display substrate according to an exemplary embodiment of the invention includes a base substrate 100, a gate line GL, a data line DL, a TFT, a first passivation layer 141, a second passivation layer 142 and a pixel electrode PE. The TFT includes a gate electrode GE, a gate insulation layer 110, an active pattern 129, an insulation pattern 131, a source electrode SE and a drain electrode DE.

The gate line GL extends in a first direction D1, and the data line DL extends in a second direction D2 in a plan view. The gate electrode GE may protrude from the gate line GL in the second direction D2. The gate insulation layer 110 may be disposed on the base substrate 100 to cover the gate line GL and the gate electrode GE.

The active pattern 129 on the gate insulation layer 110 overlaps the gate electrode GE. The active pattern 129 may include a metal oxide semiconductor that may be substantially the same as or similar to that of the active pattern 120 described with reference to FIGS. 1 and 2.

The active pattern 129 may be divided into a first portion 126, a second portion 127, a third portion 128, a fourth portion 124 and a fifth portion 125 depending on the fluorine content.

The first portion 126 of the active pattern 129 overlaps the gate electrode GE and the insulation pattern 131. The first portion 126 of the active pattern 129 may not directly contact the first passivation layer 140, so that fluorine atoms may not diffuse from the first passivation layer 141 to the first portion 126 of the active pattern 129. The first portion 126 may not include fluorine or may include relatively small fluorine content. Further, the metal oxide semiconductor of the first portion 126 may include an oxygen content substantially smaller than that of an intrinsic semiconductor. Therefore, the metal oxide semiconductor of the first portion 126 may include a p-type semiconductor which includes a plurality of oxygen vacancies and have a relative large hole density. The first portion 126 of the active pattern 129 serves as a channel region of the TFT.

The second portion 127 and the third portion 128 of the active pattern 129 directly contact the first portion 126. Further, the second portion 127 and the third portion 128 may be spaced apart from each other in the first direction D1. The second portion 127 and the third portion 128 may not overlap the insulation pattern 131, the source electrode SE and the drain electrode DE, and may directly contact the first passivation layer 141. Therefore, the second portion 127 and the third portion 128 may include a fluorine content substantially larger than that of the first portion 126, and may include an n-type semiconductor. Further, the second portion 127 and the third portion 128 may have a relatively larger electron density and a relatively high electrical conductivity. Therefore, the second portion 127 and the third portion 128 do not serve as the channel region of the TFT. The second portion 127 and the third portion 128 may effectively reduce an electrical resistance between the source/drain electrode SE/DE and the channel region of the TFT.

The fourth portion 124 and the fifth portion 125 of the active pattern 129 may be substantially the same as or similar to the fourth portion 124 and the fifth portion 125 described with reference to FIGS. 1 and 2.

The insulation pattern 131 is disposed on the active pattern 129 and the gate insulation layer 110. In exemplary embodiments, openings 133 and 135 may be defined in the insulation pattern 131. The first opening 133 and the second opening 135 may pass through the insulation pattern 131 and may partially expose the active pattern 129.

In an exemplary embodiment, the first opening 133 may expose the second portion 127 and the fourth portion 124 of the active pattern 120, and the second opening 135 may expose the third portion 128 and the fifth portion 125 of the active pattern 120. The first opening 133 and the second opening 135 may have a shape that may protrude toward the gate electrode GE. Therefore, a length of the channel region may decrease.

The insulation pattern 131 may protect the active pattern 129 during the processes of manufacturing the TFT, particularly an etching process. That is, the insulation pattern 131 may serve as an etch stopper for protecting the active pattern 129.

The source electrode SE and the drain electrode DE are spaced apart from each other, and contact the active pattern 129. Particularly, the source electrode SE may overlap the fourth portion 124 of the active pattern 129, and the drain electrode DE may overlap the fifth portion 125 of the active pattern 129.

The first passivation layer 141 may cover the TFT. The first passivation layer 141 includes an inorganic insulation material comprising fluorine. Particularly, the first passivation layer 141 may include an inorganic insulation material that is substantially the same as or similar to that of the passivation layer 140 described with reference to FIGS. 1 and 2.

Further, the second passivation layer 142 may be disposed on the first passivation layer 141. The second passivation layer 142 may include a material different from that of the first passivation layer 141. That is, the second passivation layer 142 may not include fluorine. In an exemplary embodiment, the second passivation layer 142 may include silicon oxide, silicon nitride or silicon oxy-nitride, for example, and may protect the first passivation layer 141.

According to exemplary embodiments, the TFT of the display substrate may include the channel region (that is, the first portion 126) which may be self-aligned not to overlap the insulation pattern 131. Due to the shapes of the openings 133 and 135 of the insulation pattern 131, the length of the channel region may decrease. Therefore, an operation speed of the TFT may be improved.

In the exemplary embodiment illustrated with reference to FIGS. 1 and 2, the TFT of the display substrate may include the insulation pattern 130, and openings 132 and 134 that have a rectangular shape in a plan view are defined in the insulation pattern 130. In another exemplary embodiment, the shapes of the insulation pattern may be changed. Hereinafter, another display substrate having a TFT including insulation pattern will be explained, in which the insulation pattern 230 may have an isolated island shape.

Figure 16:
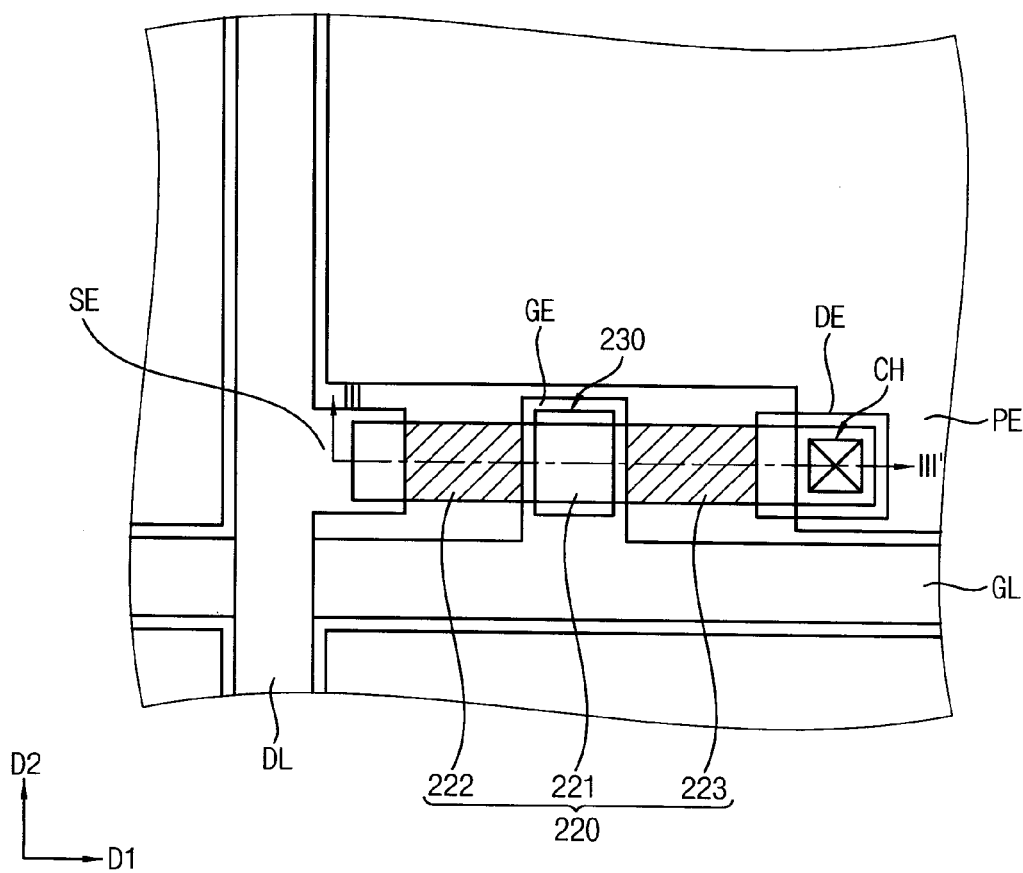
FIG. 16 is a plan view illustrating another exemplary embodiment of a display substrate according to the invention.
Figure 17:
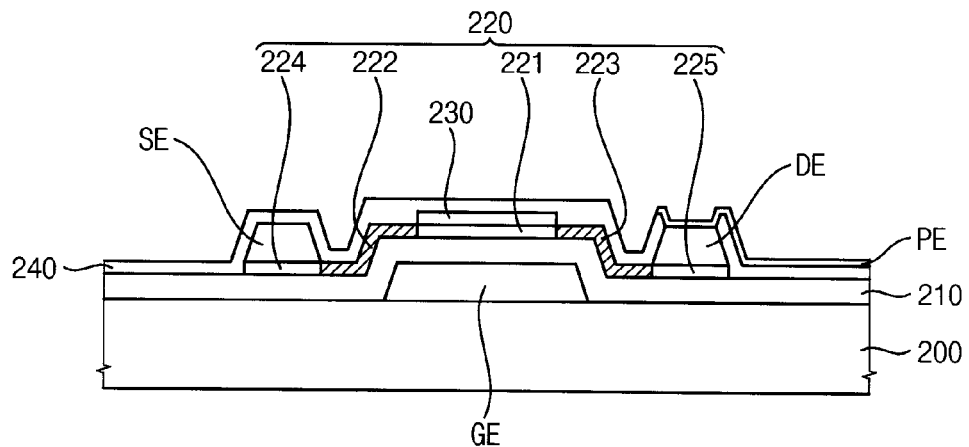
FIG. 17 is a cross-sectional view taken along line III-III' of FIG. 16.

FIG. 16 is a plan view illustrating a display substrate according to another exemplary embodiment of the invention, and FIG. 17 is a cross-sectional view taken along line III-III' of FIG. 16.

Referring to FIGS. 16 and 17, the display substrate according to an exemplary embodiment of the invention includes a base substrate 200, a gate line GL, a data line DL, a TFT, a passivation layer 240 and a pixel electrode PE. The TFT includes a gate electrode GE, a gate insulation layer 210, an active pattern 220, an insulation pattern 230, a source electrode SE and a drain electrode DE.

The gate line GL extends in a first direction D1, and the data line DL extends in a second direction D2 in a plan view. The gate electrode GE may protrude from the gate line GL in the second direction D2. The gate insulation layer 210 may be disposed on the base substrate 200 to cover the gate line GL and the gate electrode GE.

The active pattern 220 on the gate insulation layer 210 overlaps the gate electrode GE. The active pattern 220 may include a metal oxide semiconductor that may be substantially the same as or similar to that of the active pattern 120 described with reference to FIGS. 1 and 2. The active pattern 220 may include a first portion 221, a second portion 222, a third portion 223, a fourth portion 224 and a fifth portion 225 depending on the fluorine content.

The insulation pattern 230 is disposed on the active pattern 220 to overlap the gate electrode GE. That is, the insulation pattern 230 has the isolated island shape. Therefore, the insulation pattern 230 may cover the first portion 221 of the active pattern 220, and may not cover the second to fifth portion 222, 223, 224 and 225 of the active pattern 220. The insulation pattern 230 may serve as an etch stopper for protecting the active pattern 220.

The source electrode SE and the drain electrode DE are spaced apart from each other, and contact the active pattern 220. Particularly, the source electrode SE may overlap the fourth portion 224 of the active pattern 220, and the drain electrode DE may overlap the fifth portion 225 of the active pattern 220.

The passivation layer 240 may cover the TFT. Particularly, the passivation layer 240 may include an inorganic insulation material that is substantially the same as or similar to that of the passivation layer 140 described with reference to FIGS. 1 and 2.

In the exemplary embodiment illustrated with reference to FIGS. 1 and 2, the TFT of the display substrate may be a bottom gate structure. In another exemplary embodiment, the TFT of the display substrate may be a top gate structure. Hereinafter, another exemplary embodiment of a display substrate having a TFT having the top gate structure will be explained.

Figure 18:
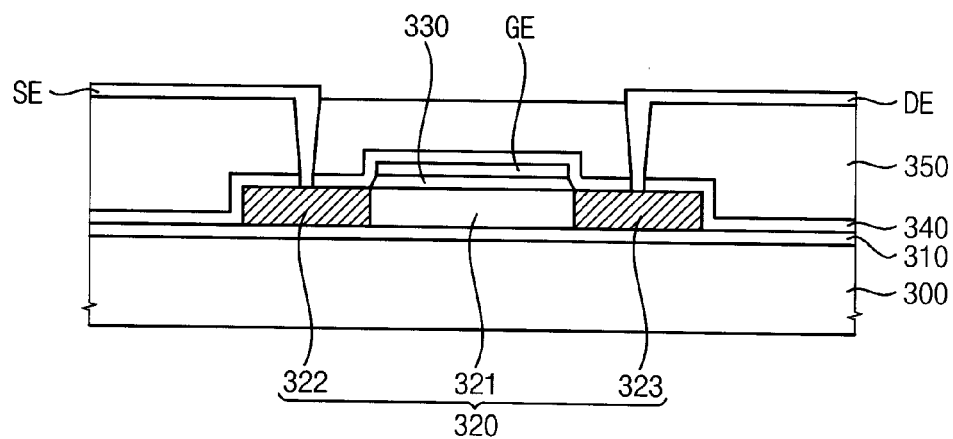
FIG. 18 is a plan view illustrating another exemplary embodiment a display substrate according to of the invention.

FIG. 18 is a cross-sectional view illustrating a display substrate according to another exemplary embodiment of the invention.

Referring to FIG. 18, the display substrate according to an exemplary embodiment of the invention includes a base substrate 300, an active pattern 320, a gate insulation pattern 330, a gate electrode GE, a passivation layer 340, a planarization layer 350, a source electrode SE and a drain electrode DE.

A buffer layer 310 is disposed on the base substrate 300. In an exemplary embodiment, the buffer layer 310 may include an organic material or an inorganic material such as silicon oxide or silicon nitride.

The active pattern 320 is disposed on the buffer layer 310. In an exemplary embodiment, the active pattern 320 may include a metal oxide semiconductor. That is, the active pattern 320 may include oxide of indium, zinc, gallium, tin or hafnium, for example. In an exemplary embodiment, the active pattern 320 may include IZTO, IGZO or HIZO. The metal oxide semiconductor of the active pattern 320 may include an oxygen content substantially smaller than that of an intrinsic semiconductor. Therefore, the metal oxide semiconductor of the active pattern 320 may include a p-type semiconductor which includes a plurality of oxygen vacancies and have a relative large hole density.

The active pattern 320 may be divided into a first portion 321, a second portion 322 and a third portion 323 depending on a carrier density.

The first portion 321 of the active pattern 320 overlaps the gate insulation pattern 330. The first portion 321 of the active pattern 320 may not directly contact the passivation layer 340, so that fluorine atoms may not diffuse from the passivation layer 340 to the first portion 321. The first portion 321 of the active pattern 320 serves as a channel region of the TFT. Therefore, the channel region of the TFT may be self-aligned to overlap the gate insulation pattern 330.

The second portion 322 and the third portion 323 of the active pattern 320 directly contact the first portion 321. Further, the second portion 322 and the third portion 323 may be spaced apart from each other in the first direction D1. The second portion 322 and the third portion 323 may not overlap the gate insulation pattern 330, and may directly contact the passivation layer 340. Therefore, the second portion 322 and the third portion 323 may include a fluorine content substantially larger than that of the first portion 321, and may include an n-type semiconductor. Further, the second portion 322 and the third portion 323 may have a relatively larger electron density and a relatively high electrical conductivity. The second portion 322 and the third portion 323 may effectively reduce an electrical resistance between the source/drain electrode SE/DE and the channel region of the TFT.

The gate insulation pattern 330 may be disposed on the first portion 321 of the active pattern 320. In an exemplary embodiment, the gate insulation pattern 330 may include silicon oxide such as BPSG, TOSZ, USG, SOG, FOX, TEOS, HDP-CVD, etc. In another exemplary embodiment, the gate insulation pattern 330 may have a multilayer structure including silicon oxide and silicon nitride. Further, the gate insulation pattern 330 may as an etch stopper while patterning the gate electrode GE.

The gate electrode GE is disposed on the gate insulation pattern 330. The gate electrode GE may include copper, silver, chromium, molybdenum, aluminum, titanium, manganese, alloy thereof and the like. The gate electrode GE may have a single-layered structure, or a multi-layered structure including a plurality of metal layers including different metals.

The passivation layer 340 covers the gate electrode GE and the active pattern 320. The passivation layer 340 includes an inorganic insulation material comprising fluorine. In an exemplary embodiment, the passivation layer 340 may include fluorinated silicon oxide (SiOF), fluorinated silicon nitride (SiNF), fluorinated silicon carbide (SiCF), fluorinated silicon oxy-nitride (SiONF), fluorinated silicon oxy-carbide (SiOCF), or any combinations thereof. Further, the planarization layer 350 may include an inorganic insulation material and may have a flat top surface.

The source electrode SE and the drain electrode DE may be electrically connected to the second portion 322 and the third portion 323 of the active pattern 320, respectively.

FIGS. 19 to 22 are plan views and cross-sectional views illustrating a method of manufacturing the display substrate illustrated in FIG. 18.

Figure 19:
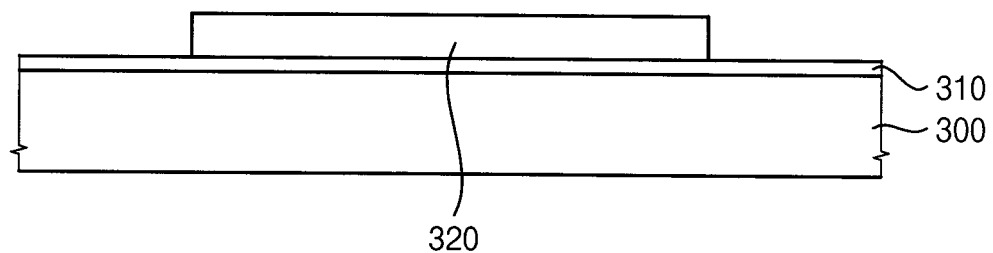
FIGS. 19 to 22 are plan views and cross-sectional views illustrating a method of manufacturing the display substrate illustrated in FIG. 18.

Referring to FIG. 19, a buffer layer 310 and an active pattern 320 are disposed on a base substrate 300.

The buffer layer 310 is disposed on the base substrate 300 to have a flat top surface. In an exemplary embodiment, the buffer layer 310 may be provided using an inorganic material or an organic material such as silicon oxide or silicon nitride.

Then, a metal oxide semiconductor layer is disposed on the buffer layer 310, and the metal oxide semiconductor layer is patterned to provide the active pattern 320. The metal oxide semiconductor layer may be provided through a physical vapor deposition process such as a vacuum deposition process or a sputtering process. The metal oxide semiconductor layer may be provided at a relatively high temperature above about 700° C. In an exemplary embodiment, metal oxide semiconductor layer may be provided using a sputtering target.

The active pattern 320 may include a metal oxide semiconductor. That is, the active pattern 320 may include oxide of indium, zinc, gallium, tin or hafnium. In an exemplary embodiment, the active pattern 320 may include IZTO, IGZO or HIZO, for example. In an exemplary embodiment, the metal oxide semiconductor of the active pattern 320 may include an oxygen content substantially smaller than that of an intrinsic semiconductor. Therefore, the metal oxide semiconductor of the active pattern 320 may include a p-type semiconductor which includes a plurality of oxygen vacancies and have a relative large hole density.

In an exemplary embodiment, a light blocking pattern may be further provided under the active pattern 320, such that a photoelectron may not be occurred in the active pattern 320.

Figure 20:
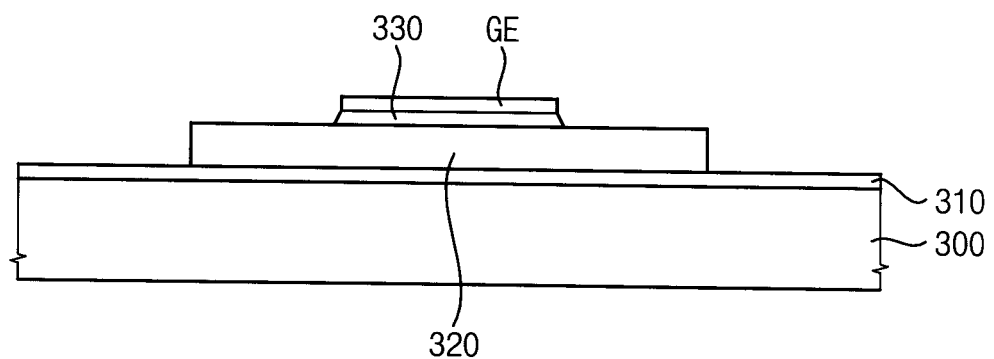

Referring to FIG. 20, a gate insulation pattern 330 and a gate electrode GE are disposed on the active pattern 320.

Particularly, a gate insulation layer and a gate metal layer are sequentially stacked on the buffer layer 310, and then the gate insulation layer and the gate metal layer are partially etched to provide the gate insulation pattern 330 and the gate electrode GE.

In exemplary embodiments, the gate insulation layer may include silicon oxide such as BPSG, TOSZ, USG, SOG, FOX, TEOS, HDP-CVD, etc. In another exemplary embodiment, the gate insulation pattern 330 may have a multilayer structure including silicon oxide and silicon nitride, for example.

The gate metal layer may include copper, silver, chromium, molybdenum, aluminum, titanium, manganese, alloy thereof and the like. In another exemplary embodiment, the gate electrode GE may have a single-layered structure, or a multi-layered structure including a plurality of metal layers including different metals.

Figure 21:
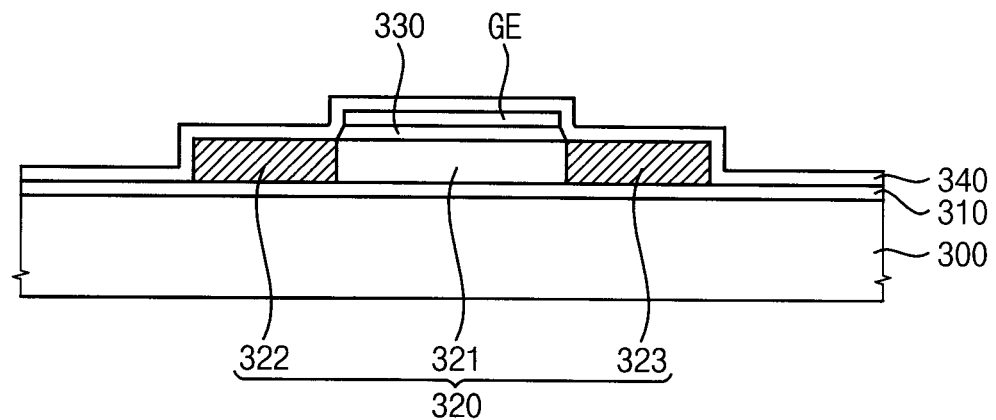

Referring to FIG. 21, a passivation layer 340 may cover the gate electrode GE and the active pattern 320.

The passivation layer 340 may be provided by a CVD process, an ALD process or a PECVD process. The passivation layer 340 may be provided using an inorganic insulation material comprising fluorine. In an exemplary embodiment, the passivation layer 340 may include fluorinated silicon oxide (SiOF), fluorinated silicon nitride (SiNF), fluorinated silicon carbide (SiCF), fluorinated silicon oxy-nitride (SiONF), fluorinated silicon oxy-carbide (SiOCF) or any combinations thereof.

In an exemplary embodiment, the passivation layer 340 may be provided by a PECVD process using a silicon tetrafluoride ($SiF_4$) gas and a nitrous oxide ($N_2O$) gas as source gases. In an exemplary embodiment, the PECVD process may provide a SiOF layer.

In another exemplary embodiment, the passivation layer 340 may be provided by a PECVD process using a silicon tetrafluoride ($SiF_4$) gas, a silane gas ($SiH_4$) and an oxygen ($O_2$) as source gases. In an exemplary embodiment, the PECVD process may also provide a SiOF layer.

As the passivation layer 340 is disposed on the active pattern 320, fluorine atoms in the passivation layer 340 may diffuse into portions of the active pattern 320 which may directly contact the passivation layer 340. The portions of the active pattern 320 may be converted from the p-type semiconductor to an n-type semiconductor. Therefore, the active pattern 320 may be divided into a first portion 321, a second portion 322 and a third portion 323.

The first portion 321 of the active pattern 320 overlaps the gate insulation pattern 330. The first portion 321 of the active pattern 320 may not directly contact the passivation layer 340, so that fluorine atoms may not diffuse from the passivation layer 340 to the first portion 321. The first portion 321 of the active pattern 320 serves as a channel region of the TFT. Therefore, the channel region of the TFT may be self-aligned to overlap the gate insulation pattern 330.

The second portion 322 and the third portion 323 of the active pattern 320 directly contact the first portion 321. Further, the second portion 322 and the third portion 323 may be spaced apart from each other in the first direction D1. The second portion 322 and the third portion 323 may not overlap the gate insulation pattern 330, and may directly contact the passivation layer 340. Therefore, the second portion 322 and the third portion 323 may include a fluorine content substantially larger than that of the first portion 321, and may include an n-type semiconductor. Further, the second portion 322 and the third portion 323 may have a relatively larger electron density and a relatively high electrical conductivity. The second portion 322 and the third portion 323 may effectively reduce an electrical resistance between the source/drain electrode SE/DE and the channel region of the TFT.

Figure 22:
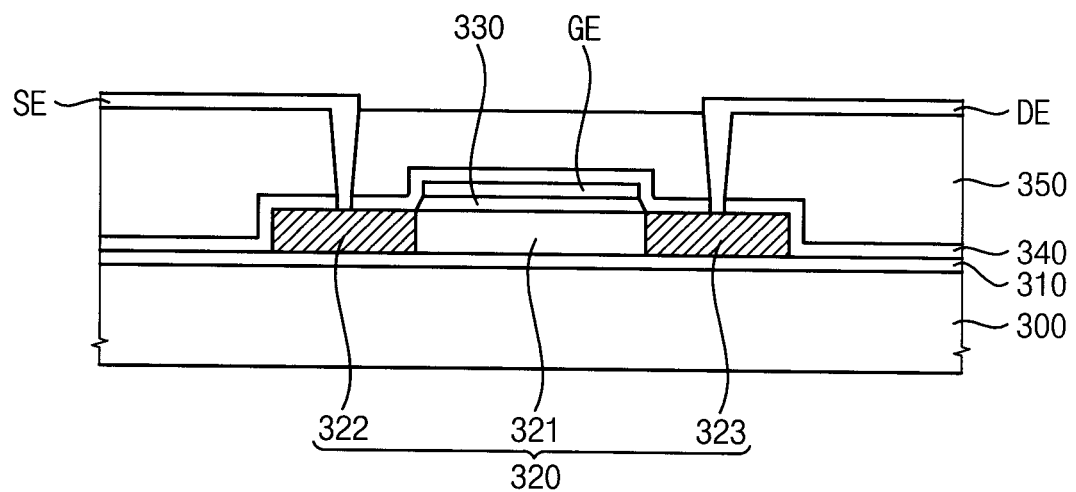

Referring to FIG. 22, after providing a planarization layer 350 on the passivation layer 340, a source electrode SE and a drain electrode DE may be provided.

The planarization layer 350 may be provided using an organic material by a spin coating process or a CVD process, for example.

Then, the planarization layer 350 and the passivation layer 340 are partially removed to provide contact holes, a metal layer fills the contact holes, and then the metal layer is patterned to provide the source electrode SE and the drain electrode DE.

Embodiments of the invention may be used for a display device such as a liquid crystal display device or an OLED.

The foregoing is illustrative of the teachings and is not to be construed as limiting thereof. Although a few exemplary embodiments have been described, those skilled in the art will readily appreciate from the foregoing that many modifications are possible in the exemplary embodiments without materially departing from the novel teachings and advantages of the of invention. Accordingly, all such modifications are intended to be included within the scope of the exemplary embodiments. In the claims, means-plus-function clauses are intended to cover the structures described herein as performing the recited function and not only structural equivalents but also functionally equivalent structures.

What is claimed is:
1. A display substrate, comprising
a gate electrode on a base substrate;
an active pattern which overlaps the gate electrode and comprises a metal oxide semiconductor;
an insulation pattern on the active pattern;
a source electrode which contacts the active pattern;
a drain electrode which contacts the active pattern and is spaced apart from the source electrode; and
a first passivation layer which covers the active pattern and the insulation pattern, and comprises fluorine,
wherein the active pattern comprises:
a first portion which directly contacts the insulation pattern and overlaps the gate electrode and the insulation pattern;

a second portion which contacts the first passivation layer and has an electrical conductivity substantially larger than an electrical conductivity of the first portion;

a third portion which contacts the first passivation layer, has an electrical conductivity substantially larger than the electrical conductivity of the first portion and is spaced apart from the second portion;

a fourth portion contacting the second portion and overlapping the source electrode; and a fifth portion contacting the third portion and overlapping the drain electrode, wherein the fourth portion and the fifth portion comprise a p-type semiconductor and include fluorine contents smaller than those of the second portion and third portion.

2. The display substrate of claim 1, wherein the first passivation layer further comprises fluorinated silicon oxide, fluorinated silicon nitride, fluorinated silicon carbide, fluorinated silicon oxy-nitride, fluorinated silicon oxy-carbide, or any combinations thereof.

3. The display substrate of claim 1, wherein
the first portion comprises a p-type semiconductor, and
the second portion and the third portion comprise an n-type semiconductor.

4. The display substrate of claim 1, wherein the second portion and the third portion include a fluorine content larger than that of the first portion.

5. The display substrate of claim 1, wherein the source electrode and the drain electrode are exposed by the insulation pattern.

6. The display substrate of claim 1, wherein the metal oxide semiconductor includes a tin content thereof between about 1 wt % to about 10 wt %.

7. The display substrate of claim 1, wherein the second portion and the third portion have a carrier density of between about $1E18/cm^3$ to about $1E22/cm^3$.

8. The display substrate of claim 1, wherein the gate electrode is disposed between the base substrate and the active pattern.

9. The display substrate of claim 1, wherein the active pattern is disposed between the base substrate and the gate electrode.

10. The display substrate of claim 1, wherein openings which expose the second portion and the third portion of the active pattern are defined in the insulation pattern.

11. The display substrate of claim 1, wherein the insulation pattern has an isolated island shape.

12. The display substrate of claim 1, wherein the second portion and the third portion of the active pattern are exposed by the insulation pattern, the source electrode and the drain electrode.

13. The display substrate of claim 1, further comprising a second passivation layer disposed on the first passivation layer.

14. The display substrate of claim 13, wherein the second passivation layer comprises silicon oxide or silicon nitride.

15. A method of manufacturing a display substrate, the method comprising:
forming a gate electrode on a base substrate;
forming an active pattern overlapping the gate electrode, the active pattern comprising:
a metal oxide semiconductor;
a first portion which directly contacts the insulation pattern and overlaps the gate electrode and the insulation pattern;
a second portion which contacts the first passivation layer;
a third portion which contacts the first passivation layer, the third portion spaced apart from the second portion;
a fourth portion contacting the second portion and overlapping the source electrode; and
a fifth portion contacting the third portion and overlapping the drain electrode,
wherein the fourth portion and the fifth portion comprise a p-type semiconductor and include fluorine contents smaller than those of the second portion and third portion;
forming an insulation pattern partially covering the active pattern;
forming a source electrode and a drain electrode contacting the active pattern; and
forming a first passivation layer to cover the active pattern and the insulation pattern, the first passivation layer comprising fluorine,
wherein
the forming the active pattern comprises forming a metal oxide semiconductor layer including a p-type semiconductor, and
the forming the first passivation layer comprises implanting fluorine atoms into portions of the active pattern, thereby converting the p-type semiconductor of the active pattern to an n-type semiconductor.

16. The method of claim 15, further comprising forming a second passivation layer on the first passivation layer.

* * * * *